United States Patent [19]
Schmid et al.

[11] Patent Number: 5,394,825
[45] Date of Patent: Mar. 7, 1995

[54] METHOD AND APPARATUS FOR GROWING SHAPED CRYSTALS

[75] Inventors: Frederick Schmid, Marblehead; Chandra P. Khattak, Danvers; Vladimir Gorbulev, Stoughton, all of Mass.

[73] Assignee: Crystal Systems, Inc., Salem, Mass.

[21] Appl. No.: 843,474

[22] Filed: Feb. 28, 1992

[51] Int. Cl.$^6$ .............................................. C30B 15/14
[52] U.S. Cl. ........................................ 117/13; 117/25; 117/210
[58] Field of Search ................ 156/617.1, 618.1, 620.1, 156/620.2; 422/246, 249

[56] References Cited

U.S. PATENT DOCUMENTS

| | | | |
|---|---|---|---|
| 3,060,065 | 10/1962 | Orem | 148/1.6 |
| 3,124,489 | 3/1964 | Vogel, Jr. et al. | 148/1.6 |
| 3,265,469 | 8/1966 | Hall | 23/273 |
| 4,116,641 | 9/1978 | Ciszek | 422/246 |
| 4,211,600 | 7/1990 | Cole | 156/608 |
| 4,325,917 | 4/1982 | Pelts et al. | 422/249 |
| 4,330,359 | 5/1982 | Lovelace et al. | 156/608 |
| 4,597,949 | 7/1986 | Jasinski et al. | 422/249 |
| 4,650,540 | 3/1987 | Stoll | 156/618 |
| 4,981,549 | 1/1991 | Yamashita et al. | 156/620.4 |
| 5,037,503 | 8/1991 | Kajimoto et al. | 156/620.1 |
| 5,037,622 | 8/1991 | Harvey et al. | 422/249 |

*Primary Examiner*—R. Bruce Breneman
*Assistant Examiner*—Felisa Garrett
*Attorney, Agent, or Firm*—Hale and Dorr

[57] ABSTRACT

A high temperature heat exchanger is used with the Czochralski crystal growing method to control the heat extraction from crystal silicon ingots as they are grown. The high temperature heat exchanger also acts as a shaping die so that silicon bars, or ingots, of various shapes, including square, circular, rectangular or ribbon, can be produced by shaping during the growth stage.

15 Claims, 8 Drawing Sheets

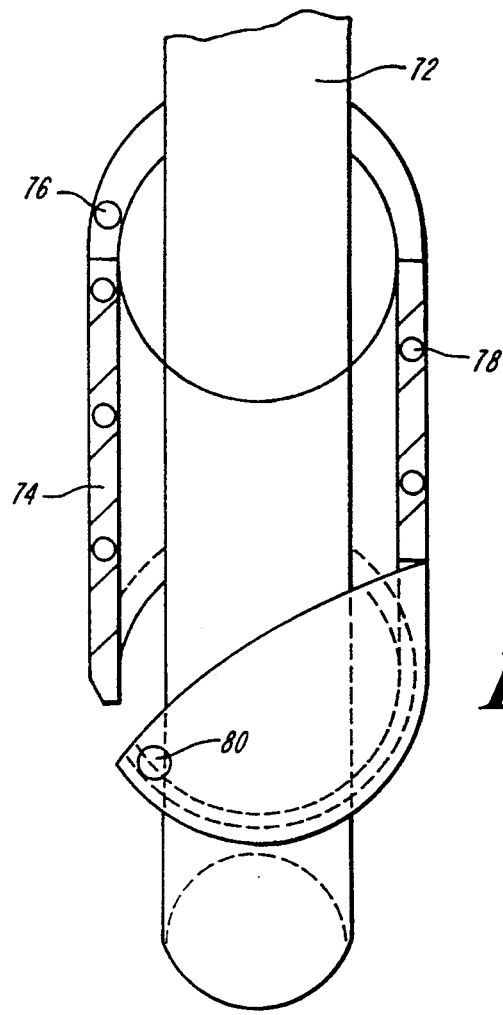
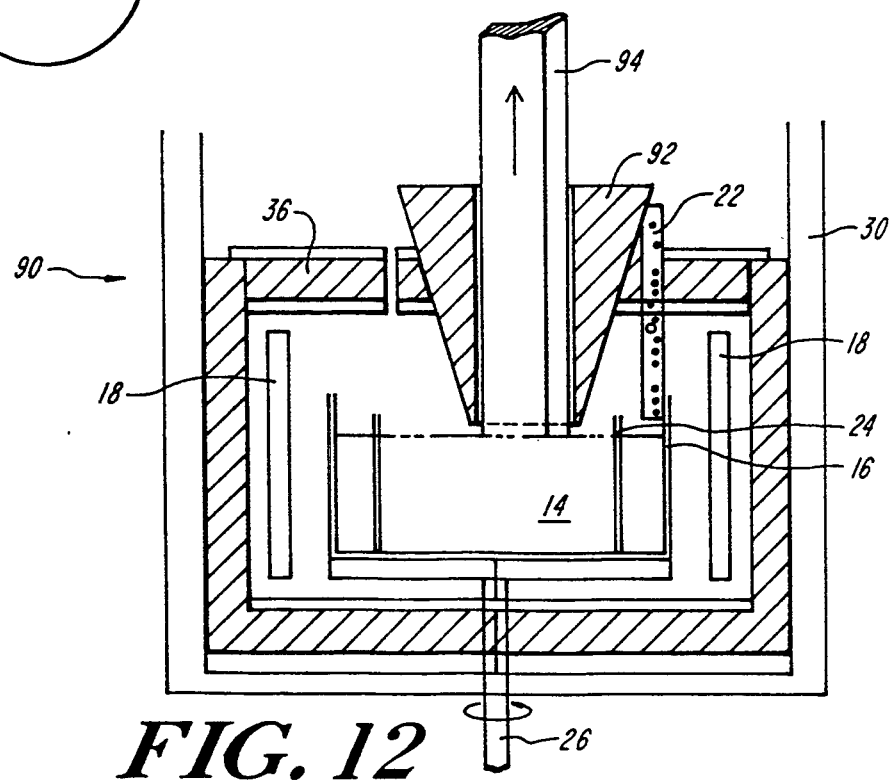
FIG. 11
FIG. 12

METHOD AND APPARATUS FOR GROWING SHAPED CRYSTALS

BACKGROUND OF THE INVENTION

The present invention relates to Heat Exchanged Crystal Growth (HECG) which uses a heat exchanger to control heat extraction and creates a controlled shaped temperature gradient for crystal growth. This process has far-reaching applications for growth of various materials with different shapes and sizes. An important aspect of this process is that both heat input and heat extraction can be controlled during crystal growth, and the heat extraction is near the solidifying crystal so that it is effective and allows for higher crystal perfection and faster growth rates. A specific application of HECG in which the heat exchanger is used in conjunction with the Czochralski (Cz) process to produce square (100) silicon ingots for photovoltiac applications is referred to as Heat Exchanged Czochralski (HEC) process. The process is described for growth of single crystal silicon, however, it has applicability for other materials in single crystal or multicrystalline forms.

Crystalline silicon produced using ingot technologies is used in large area photovoltiac modules. By reducing the cost and increasing the efficiency of wafers produced from silicon ingots, photovoltiac modules can be produced with high efficiency.

Other applications also require crystals of various shapes and sizes, which are not conveniently produced using current methods.

It is therefore an object of the present invention to provide a method for growing crystals of various materials with different shapes and sizes.

An additional object of the present invention is to provide a method for growing crystals while controlling both heat input and heat extraction.

It is a further objective of the present invention to provide a method for growing crystal with improved crystal perfection.

It is a further object of the present invention to provide a method for growing crystals with improved control and at high-growth rates.

It is also an object of the present invention to provide a method for producing high-quality shaped single crystal (100) silicon at low cost and high-efficiency.

SUMMARY OF THE INVENTION

The present invention allows crystals to be grown to shape by controlling the temperature gradient in the solid crystal by heat extraction. As an ingot or bar is pulled from a melt, a heat exchanger surrounds at least a portion of the growing ingot. The heat exchanger shapes the ingot as it is growing and controls heat extraction from the ingot. The heat exchanger may be a high-temperature heat exchanger, having helium or other fluid flowing within channels of the heat exchanger and extracting heat from the growing crystal. In another embodiment, the heat exchanger is located at an angle above the melt. In yet another embodiment, the heat exchanger is a passive radiational heat exchanger, and heat is extracted from the growing crystal to the heat exchanger.

The heat exchanger is a shaped body in which vertical and horizontal temperature gradients are produced, which causes the shape of the growing crystal to conform to a desired shape and size, including square, round, rectangular, foil, filament or plate shapes.

BRIEF DESCRIPTION OF THE DRAWINGS

Other objects, features and advantages of the invention will be apparent from the further description, together with the drawings in which:

FIG. 11 is an elevational view of the high temperature heat exchanger and round crystal of FIG. 9 shown in greater detail;

FIG. 12 is an elevational view of a fourth embodiment of the crystal-growing system of the present invention used with a passive radiational heat exchanger to grow a square crystal;

DESCRIPTION OF A PREFERRED EMBODIMENT

Figure 1:
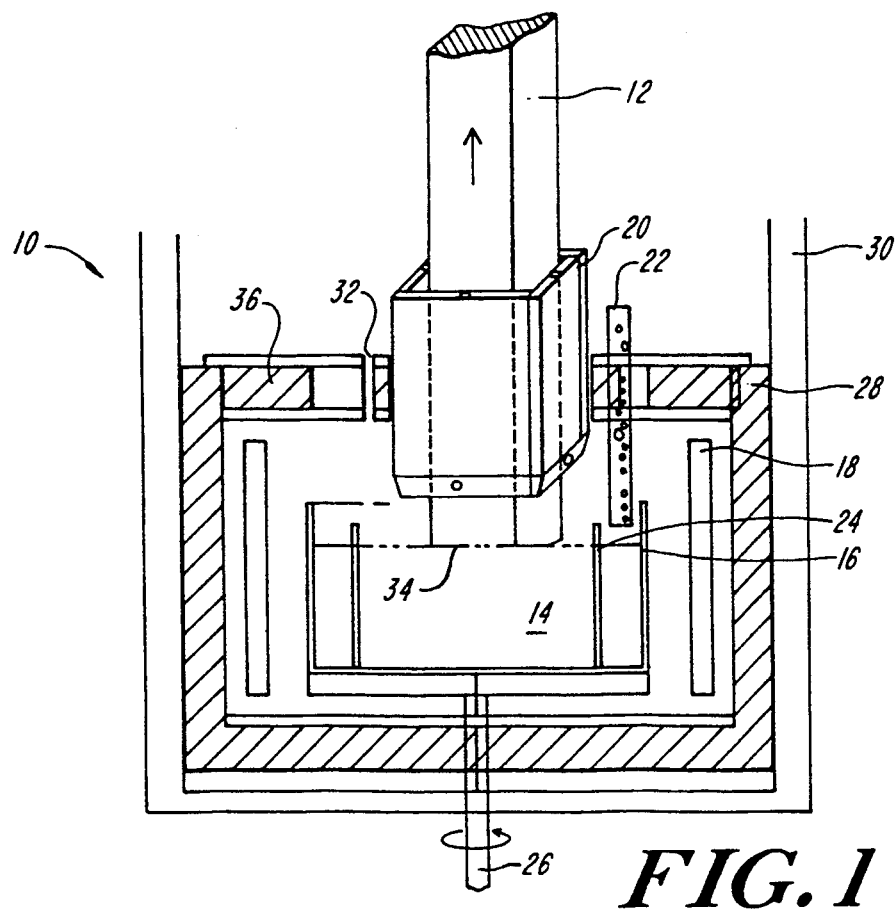
FIG. 1 is an elevational view of one embodiment of the crystal-growing system of the present invention used to grow a square crystal.

The present invention uses a high temperature heat exchanger for controlling the heat extraction from crystal silicon ingots as they are grown. The high temperature heat exchanger also acts to shape the horizontal temperature gradient of the solid ingot so that silicon bars, or ingots, of various shapes, including square, circular, rectangular or ribbon, can be produced by shaping during the growth stage.

In contrast to other crystal growth techniques, the present invention allows for direct control of heat input and also heat extraction. In addition, as the crystal growth progresses, the distance of the solid-liquid interface from the heat exchanger does not increase. Therefore, continuous growth of the ingot is possible with constant solid temperature gradient by precise control of the heat extraction with the heat exchanger.

In the present invention, the heat extraction is controlled independently from and uncoupled from the heat input, which allows for higher crystal perfection due to constant solid temperature gradient. Ingot growth occurs from the top of the melt with heat transferred from the ingot to the heat exchanger mainly by radiation. The heat extraction is in the proximity of the growing solid-liquid interface for improved control of the solid temperature gradients and thus allows for more precise control of the crystal growth process than is possible using other crystal growing methods. Using the present invention, as the crystal growth progresses, the solid crystal is pulled up through the cavity of the heat exchanger and the controlled solidification by the heat exchanger is retained in the same position.

The apparatus and process for crystal growing according to the present invention can be used to grow ingots having various forms. Long, round-shaped ingots are grown using a round heat exchanger. By varying the diameter of the heat exchanger, the ingot diameter can vary from a thin fiber to an ingot having a large diameter. A square gradient is produced using a square-shaped heat exchanger. In one embodiment, a square-shaped ingot results, particularly if the crystal has square growth facets, such as (100) silicon. In this case, the square facets of the crystal line up with the square faces of the heat exchanger. A heat exchanger in combination with currently available Cz equipment is utilized to grow four-inch square or larger cross-section (100) orientation single crystal silicon ingots for photovoltaic applications. Rectangular, plate-shaped ingots are grown using a rectangular heat exchanger. Ingots in sheet form are grown by varying the lengths of opposite sides of the rectangular heat exchanger.

In an alternate embodiment of the present invention, ingots are grown at an angle that is non-vertical. In this embodiment, the heat exchanger is used at an angle over the melt. This creates a large interface area, which allows a large area for heat extraction, and results in rapid growth of the ingot. As the angle from the horizontal decreases, the area of the interface increases which allows for increased heat extraction and growth rate. A radiational cooled heat exchanger can also be used at an angle over the melt.

In one embodiment of the present invention, a single-crystal, square cross-section bar having the near net shape required for wafering is produced. In this embodiment, silicon bars which nominally yield 10 cm × 10 cm bars with over 80 percent material utilization from the grown ingot are produced.

The process of the present invention gives higher throughput than the conventional Cz process, allows continuous production, dependent on failure of a component such as the crucible, and results in a higher yield of usable bar stock from the ingot. The equipment is simpler than the equipment used in the Cz process, and has a smaller heat zone than that used for multicrystalline silicon furnaces.

The crystal growing process of the present invention is similar to the Cz process in that a silicon ingot is pulled from a silicon melt. However, upon crystallization, the ingot is withdrawn into a heat exchanger of a desired internal shape so that the shape of the ingot conforms to the internal shape of the heat exchanger. The heat exchanger is also used to control the heat extraction from the ingot. Heat is extracted at a controllable rate at the growth site, allowing direct control of the growth process and high growth rates. The temperature can be actively controlled within the heat exchanger for controlled heat extraction to produce the desired solid temperature gradients for optimum crystal growth.

Referring to FIG. 1, the system 10 of the present invention used to grow a square crystal 12 is shown. A shallow silicon melt 14 comprised, in the preferred embodiment, of liquid silicon, is contained in an annular silica crucible 16. The crucible 16 is heated using annular heating element 18 to above the melting point of the silicon. A helium-cooled heat exchanger 20 is placed above melt level 34. The heat exchanger 20 is used to control the heat extraction, and thus increase the growth rate, as well as to shape the crystal 12 as it is growing.

In the preferred embodiment, the crucible 16 is shallow to minimize convection in the melt and the melt may be replenished through melt replacement port 22. This lowers the cost of the crucible and results in a continuous production with silicon production maintained in tight resistivity range. Placing the heat exchanger in the crystal growth furnace complements melt replenishment because it shields the growing crystal from temperature pertubations associated with melt replenishment and melt level sensing. Melt replenishment allows for continuous crystal growth. The melt level is determined by melt level sensor port 32.

Baffles 24 are used to control convection in the silicon melt 14. Baffles are placed in the crucible to prevent unmelted meltstock from coming into the area of crystal growth, allowing automatic melt replenishment with constant melt level control. Solid silicon, for example, is lighter than liquid silicon, and floats on the surface. For this case, liquid is fed under the baffle to the center portion of the crucible where growth occurs. In alternate embodiments, where the melt is comprised of materials that are heavier in solid form than in liquid, and therefore would settle to the bottom of the crucible, baffles may not be necessary.

The crucible rotates about rotator shaft 26 and is contained within furnace insulation 28 and furnace chamber 30. The crucible is rotated to assure even temperature distribution in the crucible. Rotation prevents the meltstock from settling in one area of the crucible, and distributes it around the entire periphery of the crucible. Rotation also prevents one area of the crucible from being exposed to a hot or cold spot in the heat zone.

An insulated cover 36 is used on top of the heat zone to reduce energy consumption. The controllable heat exchanger of the present invention allows the top of the furnace to be insulated to prevent significant heat loss.

In the preferred embodiment, a single crystal seed is dipped just below the surface of the silicon melt 34. The square crystal 12 is withdrawn into the heat-exchanged square cross-section die 20 so that the square crystal 12 that is formed conforms to the shape of the die. After passing through the heat exchanger 20, the square crystal 12 cools by radiational heat loss to the cooler sections of the furnace. A secondary heater can also be used to anneal the crystal after it passes through the heat exchanger cavity.

Figure 2:
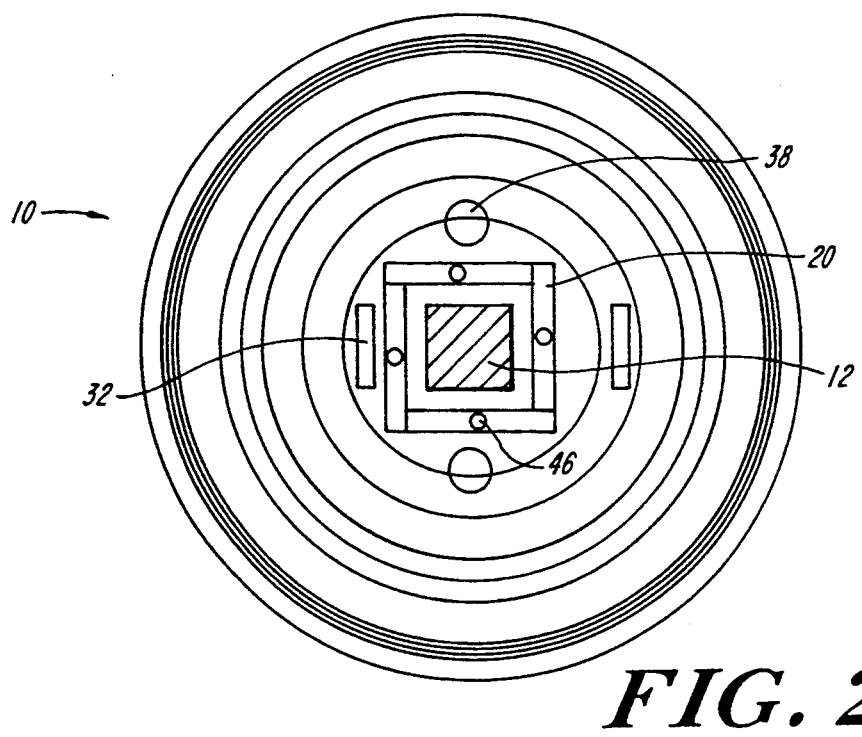
FIG. 2 is a plan view off the system shown in FIG. 1.

FIG. 2 shows the square heat exchanger 20 and square crystal 12 from a top view. View port 38 is provided.

Figure 3:
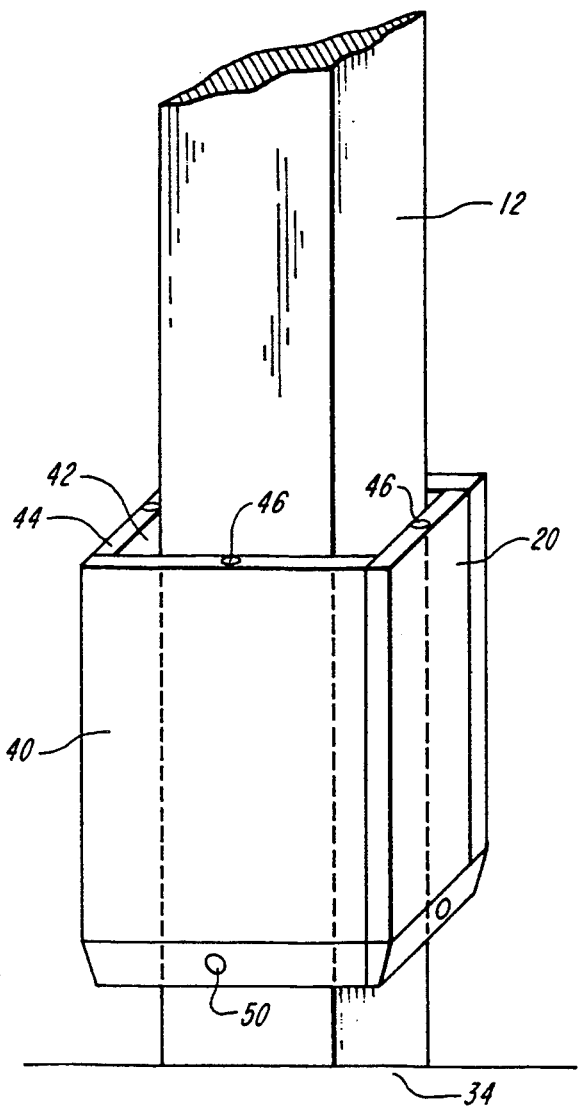
FIG. 3 is an elevational view of the high temperature heat exchanger and square crystal of FIG. 1 shown in greater detail.

FIG. 3 shows the square heat exchanger 20 and square crystal 12 in greater detail. The high temperature heat exchanger is, in one embodiment, a 20 cm high and 13×13 cm wide square cavity within the four sides. Each side 40 of the heat exchanger is double-walled, having an inner wall 42 and an outer wall 44. The four inner walls 44 of the heat exchanger may be lined with a coating or layer of high emissivity material, such as a graphite plate, to enhance the radiational heat transfer to the heat exchanger. In alternate embodiments, the plates can be extended into the melt 34 to act as a die. The distance from the crystal to the heat exchanger surface can vary, and may be up to 4 cm. The distance from the bottom edge of the heat exchanger to the liquid level can also vary, and may be up to 5 cm. The temperature gradient of the solid ingot increases as the heat exchanger comes closer to the melt surface. The heat exchanger should be distanced so that a minimum amount of heat is radiated from the melt to the heat exchanger.

A helium inlet 46 is provided at the top of each of the four double walls 40 of the heat exchanger 20. In one embodiment, helium is introduced from a recirculation pump into the volume between the inner and outer wall of each of the double walls 40 at 25° C.

Figure 4:
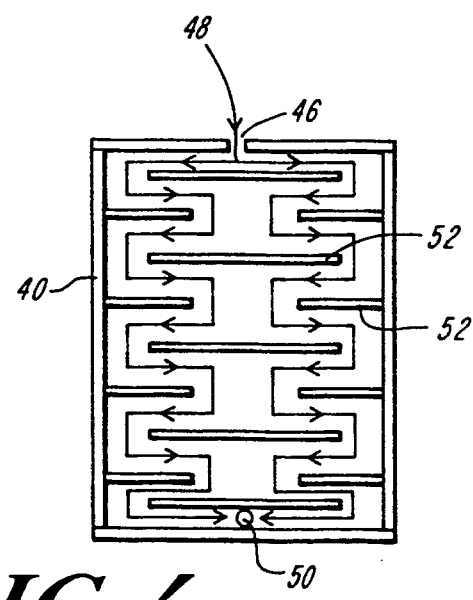
FIG. 4 is a cross-sectional view of one double-walled side of the high temperature heat exchanger of FIG. 1.

Referring to FIG. 4, one double-walled side of the heat exchanger 20 is shown. Baffles 52 are provided within the double walls to more evenly distribute the helium within the double walls 40. The baffles extend horizontally from the inner to the outer wall of each side of the heat exchanger.

In one embodiment, the helium 48 travels down through the inside of the double walls 40 of the heat exchanger at a rate of 738 liters per minute and exits through helium outlet 50 at 525° C. The square ingot, which in this embodiment is being pulled upwards at a rate of 25 cm per hour, is cooled by the helium as both the helium and the square ingot travel through the heat exchanger. In this embodiment, the square ingot is approximately 1242° C. when it enters the heat exchanger 16 and 827° C. when it exits the heat exchanger. The radiational heat loss from the ingot to the heat exchanger occurs in this case at 1120 cal/sec, and an 11 cm×11 cm square cross-section ingot is produced. In other embodiments, the temperature and rate of movement by the helium and crystal through the heat exchanger can vary.

Referring again to FIG. 1, continuous operation is achieved through the use of a shallow crucible 16 with melt replenishment 22 and melt level control 32. The total duration of the continuous cycle depends upon the rate of devitrification of the crucible and the capacity of the puller head for the crystal. The crucible is maintained close to the melt temperature of silicon, which delays devitrifrication of the silica crucible compared to cycling the temperature for multiple ingot growth. Rapid growth and high quality is achieved by optimizing the temperature of the heat exchanger near the solid/liquid interface .and the temperature gradient of the heat exchanger along its vertical height.

Figure 5:
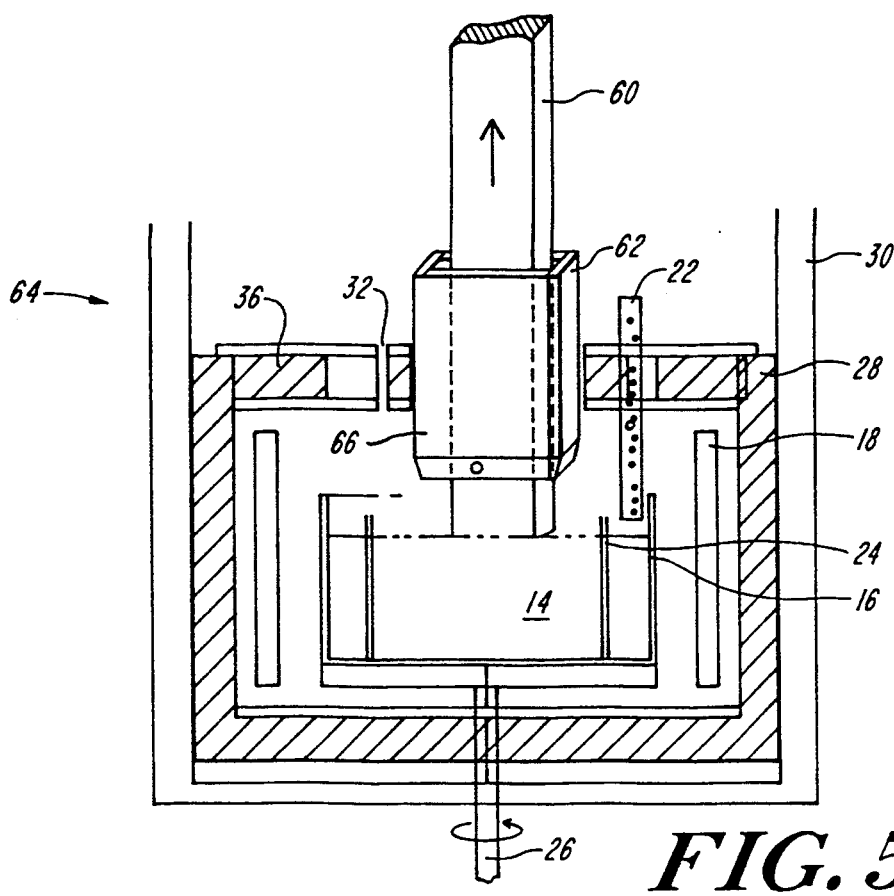
FIG. 5 is an elevational view of a second embodiment of the crystal-growing system of the present invention used to grow a rectangular crystal.

Referring to FIG. 5, the system 64 of the present invention as used to grow a rectangular crystal 60 is shown. In this embodiment, a rectangular high temperature heat exchanger 62 is provided.

Figure 6:
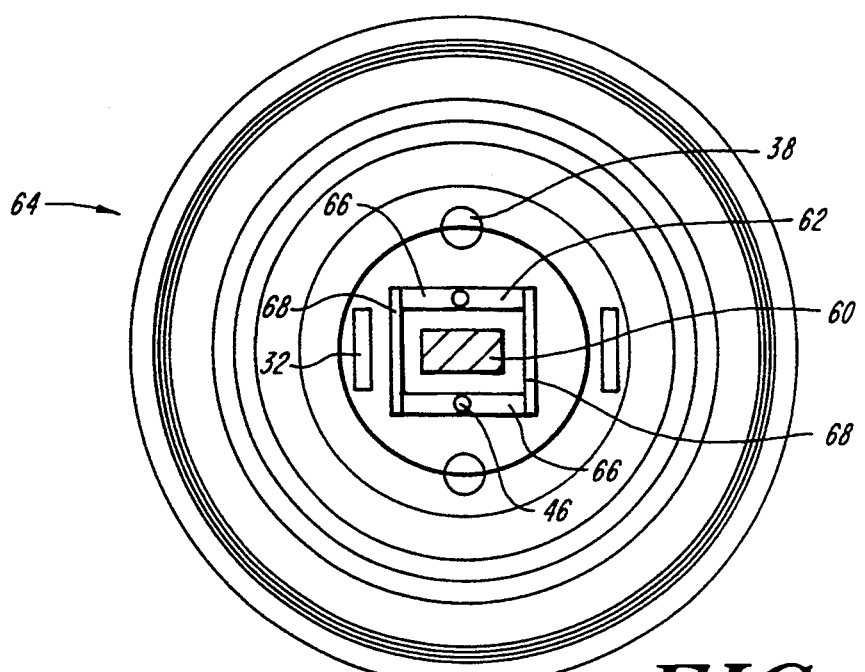
FIG. 6 is a plan view of the system shown in FIG. 5.

Referring to FIG. 6, the rectangular high temperature heat exchanger 62 has two long sides 66 and two short sides 68. In this embodiment, only the two longer sides 66 have helium inlet ports 46 helium outlet ports 50.

Figure 7:
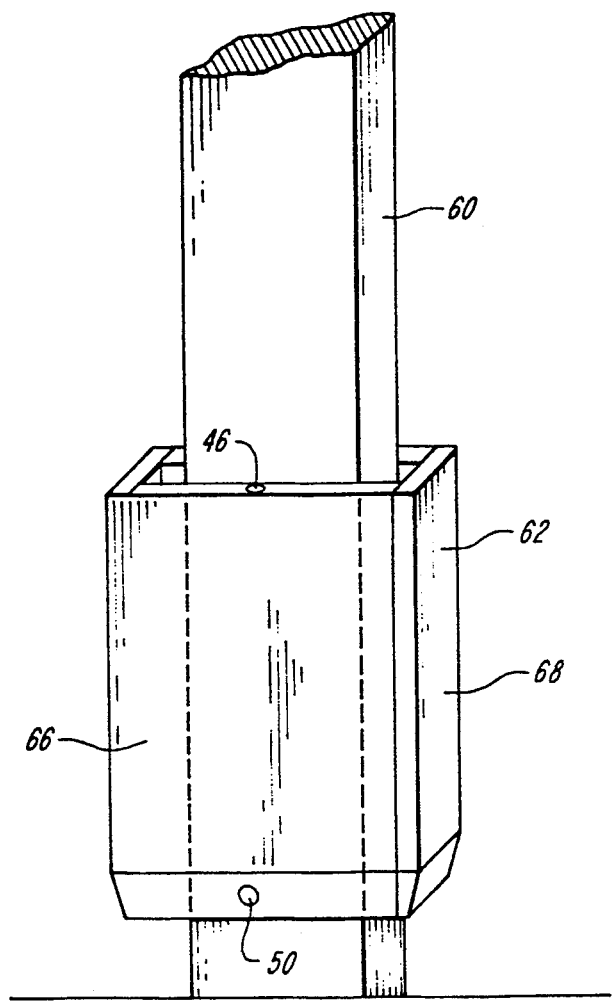
FIG. 7 is an elevational view of the high temperature heat exchanger and rectangular crystal of FIG. 5 shown in greater detail.

FIG. 7 shows the rectangular crystal 60 and the rectangular high temperature heat exchanger 62 in greater detail. Long side 66 has helium inlet port 46 and helium outlet port 50. Rectangular ingot 60 is drawn through, and shaped by rectangular heat exchanger 62.

Figure 8:
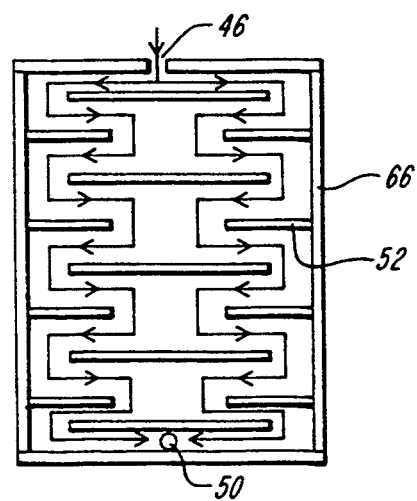
FIG. 8 is a cross-sectional view of one double-walled side of the high temperature heat exchanger of FIG. 5.

FIG. 8 shows a cross-sectional view of one longer double walled side 66. This side is similar to the double-walled side of the square cross-section heat exchanger 20 shown in FIG. 4. Helium enters through inlet port 46, travels down through hollow side 66, around baffles 52, and exits the heat exchanger through outlet port 50.

Figure 9:
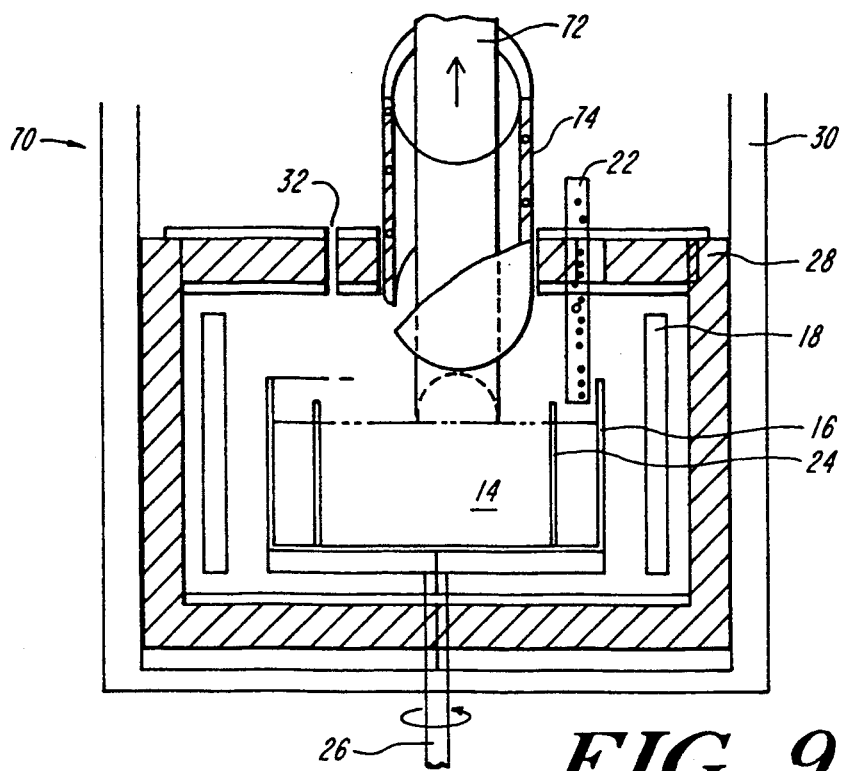
FIG. 9 is an elevational view of a third embodiment of the crystal-growing system of the present invention used to grow a round crystal.

FIG. 9 shows the system 70 of the present invention as used to grow a cylindrical crystal 72. In this embodiment, a circular cross-section high temperature heat exchanger 74 is provided. The cylindrical crystal can be rotated in the direction opposite the crucible rotation because of symmetry of the crystal with the heater.

Figure 10:
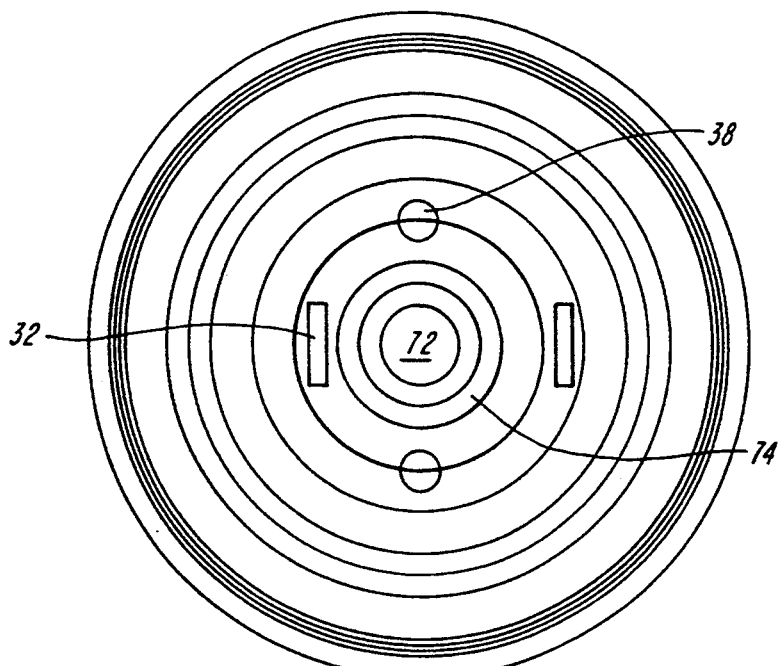
FIG. 10 is plan view of the system shown in FIG. 9.

FIG. 10 shows the circular high temperature heat exchanger 74 from a top view. Cylindrical crystal 72 is pulled through circular cross-section heat exchanger 74.

FIG. 11 shows the circular cross-section crystal 72 and the circular high temperature heat exchanger 74 in greater detail. Helium enters the heat exchanger through helium inlet port 76, travels through internal helium spiraling rod 78, and exits through helium outlet port 80.

In an alternate embodiment, the crystal is grown using the HEC furnace under a magnetic field to minimize fluctuations of the melt temperature for growth at higher growth rates and/or better quality than using the conventional Cz process.

High growth rates can be achieved by applying steep temperature gradients with the heat exchanger. High crystal perfection in compound semiconductors and ceramics can be achieved by applying low temperature gradients.

Referring to FIG. 12, an alternate embodiment 90 of the crystal-growing system of the present invention, as used with a passive radiational heat exchanger 92 to grow a square crystal 94, is shown. The crucible 16, melt 14, insulation 28, and other elements of the invention remain similar to those used with the high temperature heat exchanger shown in FIG. 1.

The passive heat exchanger does not have helium or other fluid flow through it, and depends on radiation heat transfer to a cooler body. The heat transfer from this type of heat exchanger is dependent on the conductivity of the heat exchanger material and on the cross-sectional area. The cross-section area increases as the distance from the melt increases, thereby increasing the cross-section area for heat conduction and the external surface area for radiation. A material with high conductivity and emissivity will produce high gradients and visa versa.

Figure 13:
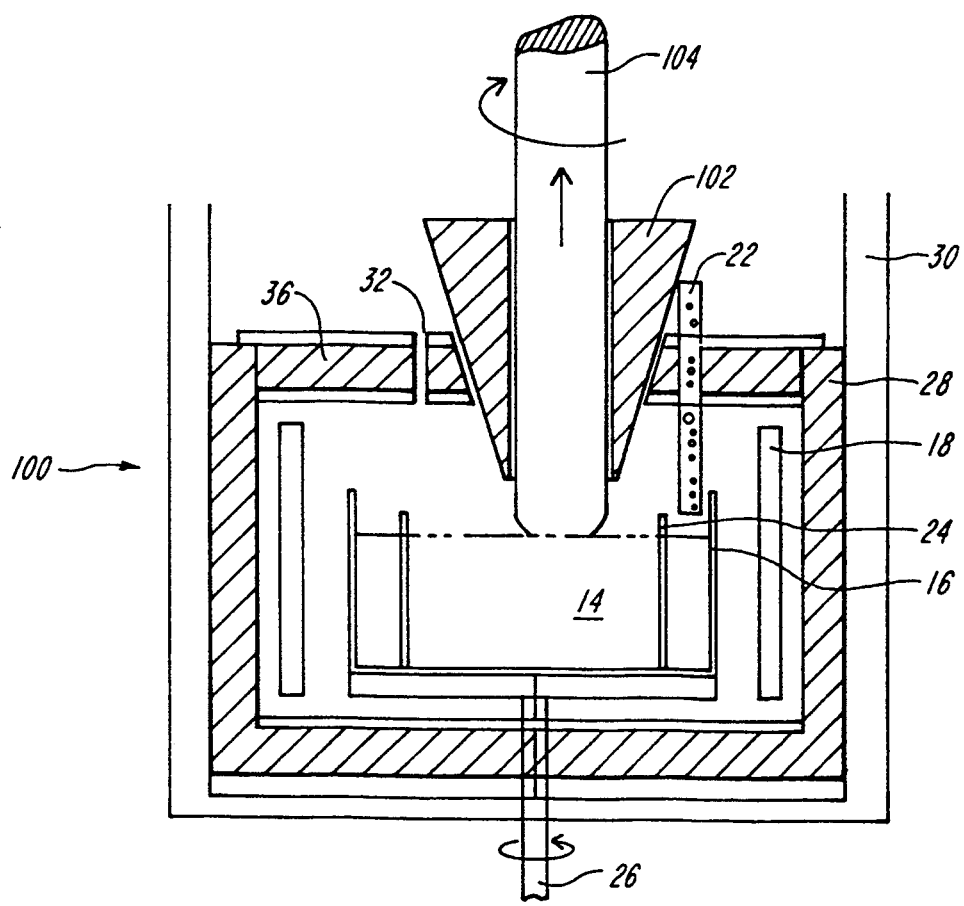
FIG. 13 is an elevational view of a fifth embodiment of the crystal-growing system of the present invention used with a passive radiational heat exchanger to grow a round crystal.

Referring to FIG. 13, an alternate embodiment 100 of the invention is shown. A passive radiational heat exchanger 102 is used to grow a round crystal 104.

Figure 14:
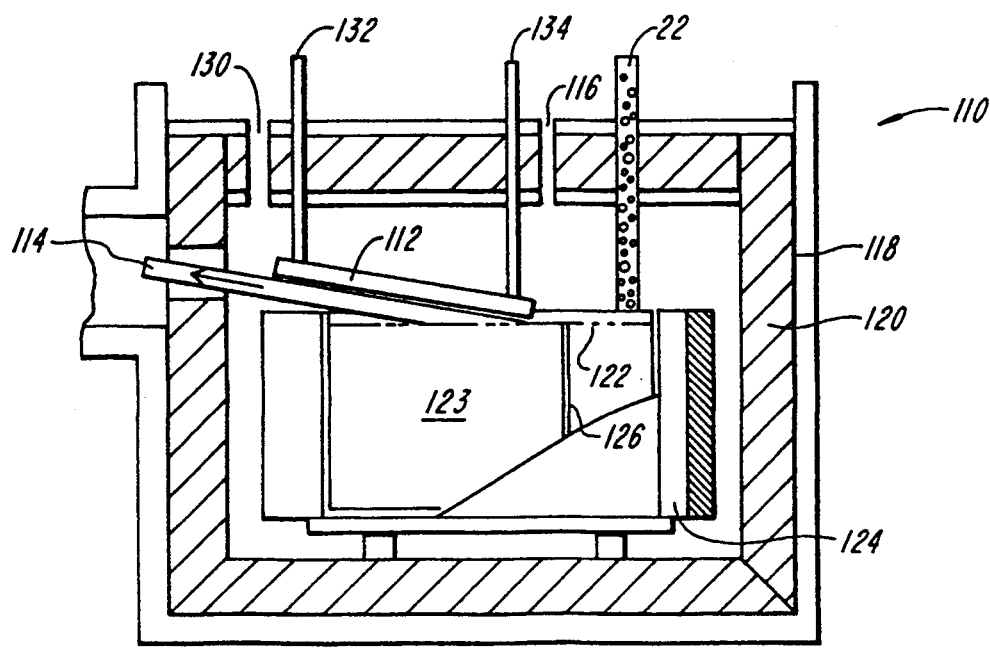
FIG. 14 is an elevation view of a sixth embodiment of the crystal growing system of the present invention having a non-vertical crystal growth arrangement.

FIG. 14 shows a further embodiment of the crystal growing system. In this embodiment, a high temperature heat exchanger 112 is used to grow a plate-shaped ingot 114 having a non-vertical crystal growth arrangement. Helium is pumped into the heat exchanger 112 through helium inlet port 132, and exits through helium outlet port 134.

Melt level sensor 116 and melt replenishment port 22 are provided to allow for automatic melt replenishment and maintain melt level 122 of melt 123. Crucible 124 has baffles 126, and is surrounded a layer of insulation 120 within furnace chamber 118. View port 130 is provided.

Figure 15:
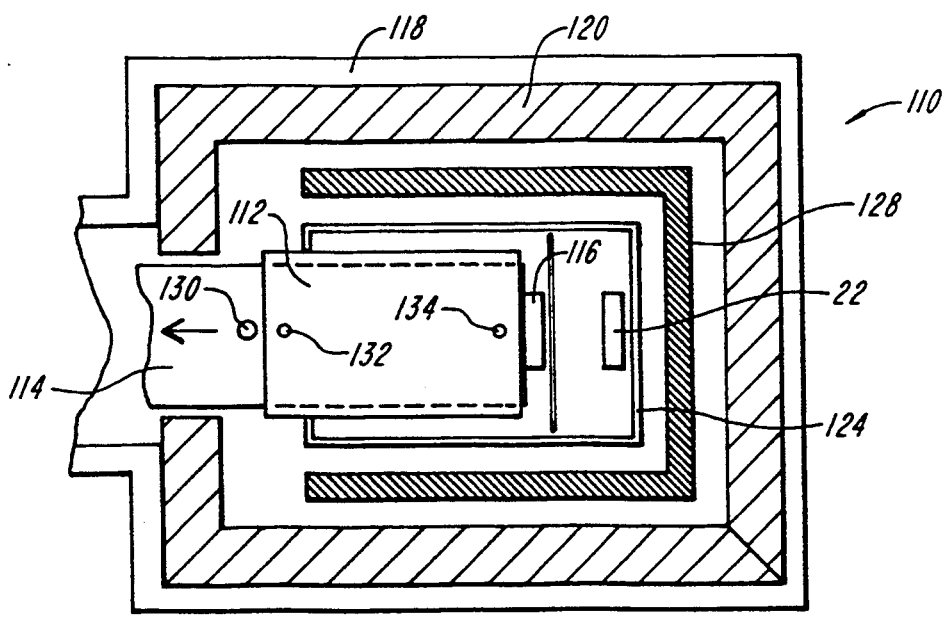
FIG. 15 is a top view of the non-vertical crystal growth arrangement shown in FIG. 14.

FIG. 15 shows the non-vertical crystal growth system 110 of FIG. 14 from a top view. Melt 123 is contained within crucible 124, and is surrounded on three sides by heater 128. High temperature heat exchanger 112 is placed at a near-horizontal angle above melt 123, and a plate-shaped crystal 114 is produced at near horizontal growth.

To function effectively, the heat exchanger must be directly in the heat zone of the furnace so that it will be exposed to the same temperature region as the crystal. The heat flow through the heat exchanger controls the temperature gradient in the heat exchanger to achieve the optimum crystal growth temperature gradient.

In each of the disclosed embodiments, the interior passage of the heat exchanger, through which the material from the melt is drawn, extends upwardly from the melt. The angle between the central axis of the passage (which as shown may be, for example, either square, round or rectangular) and the top surface of the melt varies. In the embodiments of FIGS. 1 through 13, the passage is vertical, i.e., perpendicular to the top of the melt; in the embodiment of FIGS. 14 and 15 it is inclined, i.e., non-vertical.

When a helium gas cooled refractory metal heat exchanger is used, helium pressure and flow rate can be varied to control the temperature gradient of the solid ingot. When a passive radiational cooled heat exchanger is used, there is less control. In both cases the heat exchanger is designed so that it will have minimal heat exchange from the melt surface and maximum heat exchange from the growing crystal. The heat exchanger has a gradient along its length and is hottest near the growth interface. As the distance from the interface increases, the heat exchanger becomes cooler. The temperature gradient is dependent upon the position of the heat exchanger in the heat zone and the heat extraction capability of the heat exchanger. As the heat exchanger is lowered in the heat zone to expose it to more heat, the temperature gradient will also be lowered. However, this can be offset by increasing the rate of heat extraction by the heat exchanger. As the rate of heat exchange is decreased, the temperature gradient along the length of the heat exchanger also decreases.

Using a heat exchanger for crystal growth from the top surface of the melt has many advantages. It allows direct control of heat extraction to produce the optimum temperature gradients in the solid ingot for high crystal perfection and high growth rates. Heat exchange control remains in the proximity of the solid-liquid interface and stays at the same position so that control is achieved to produce constant solid temperature gradients and long crystals with high perfection can be grown in a continuous mode. Melt replenishment is efficient and allows for continuous crystal growth. Melt replenishment of meltstock that is doped allows for a steady state composition in the melt to produce material with a constant dopant level. The heat exchanger allows the top of the furnace to be insulated and minimize energy consumption.

The crystal growing process of the present invention gives higher throughput than the conventional Cz process, allows continuous production, and results in higher yield of usable bar stock from the ingot. The equipment used in the present invention is simpler than the equipment used in the Cz process, and has a smaller heat zone than used for multicrystalline silicon furnaces.

Controlled heat extraction allows control of the solid gradient and allows shaping of the solid-liquid interface. For good crystal growth, the solid interface should be flat or convex to the liquid, but not concave, since this causes strain and lower crystal perfection. It is necessary to stay within a range of temperature gradients in the solid ingot depending upon the type and purity of the material. High conductivity materials such as metals require high temperature gradients and low conducting materials such as ceramics require low temperature gradients in the solid.

The foregoing invention has been described with reference to particular embodiments and for growth of silicon crystals. Various modifications and growth of other materials will fall within the scope of the appended claims. Growth of multicrystalline materials can also be achieved.

We claim:

1. In a crystal growth process wherein a solid material is forming by drawing upwardly from a melt, that improvement comprising the steps of:

providing an elongated heat exchanger above said melt, said heat exchanger having an inside wall portion defining a passage having an axis extending generally upwardly from said melt through which material may be drawn and an outside wall portion;

drawing said solid material upwardly through said passage of said heat exchanger along said axis in close proximity to said inside wall portion of said heat exchanger; and, controlling the extraction of heat from said solid material to said heat exchanger as it is drawn through said heat exchanger by producing in said heat exchanger a temperature gradient along the length of said heat exchanger, said gradient being such that the temperature of said interior wall portion of said heat exchanger is greatest adjacent said melt and decreases as the distance from said melt increases.

2. The crystal growth process of claim 1 wherein said axis is vertical to the top surface of said melt.

3. The crystal growth process of claim 1 wherein said axis is non-vertical to the top surface of said melt.

4. The crystal growth process of claim 1 including removing heat from said heat exchanger by radiation as said solid material is drawn through said heat exchanger.

5. The crystal growth process of claim 1 including means for removing heat from said heat exchanger as said solid material is drawn through said heat exchanger.

6. The crystal growth process of claim 1 wherein said heat exchanger has:

a pair of opposed wall portions, each said wall portion having an inner wall portion and an outer wall portion, said inner wall portion being in close proximity to said solid material being drawn through said heat exchanger;

a channel located between said inner wall portion and said outer wall portion;

an inlet port for allowing fluid at a relatively low temperature to enter said channel; and, an outlet port spaced from said inlet port towards said melt for allowing said fluid to exit said channel at a relatively higher temperature.

7. The crystal growth process of claim 6, said channel including at least one baffle placed within said channel for distributing said fluid within said channel.

8. The crystal growth process of claim 6, said fluid comprised of helium.

9. The crystal growth process of claim 6 wherein said outlet port is adjacent said melt and said inlet port is adjacent the end of said heat exchanger most distant from said melt.

10. The crystal growth process of claim 1 wherein the cross-section of said passage of said heat exchanger in a plane perpendicular to the axis of said material is a rectangular shape.

11. The crystal growth process of claim 1 wherein the cross-section of said passage of said heat exchanger in a plane perpendicular to the axis of said material is a circular shape.

12. The crystal growth process of claim 1 wherein the cross-section of said passage of said heat exchanger in a plane perpendicular to the axis of said material is a square shape.

13. The crystal growth process of claim 1, said heat exchanger including a pair of opposing plates, each defining a said inside wall portion.

14. In a crystal growth process wherein a solid material is forming by drawing upwardly from a melt, that improvement comprising the steps of:

provide an elongated heat exchanger above said melt, said heat exchanger having an inside wall portion defining a passage having an axis extending generally upwardly from said melt through which material may be drawn and an outside wall portion;

drawing said solid material upwardly through said passage of said heat exchanger along said axis in close proximity to said inside wall portion of said heat exchanger; and, controlling the extraction of heat from said solid material to said heat exchanger as it is drawn through said heat exchanger by producing in said heat exchanger a temperature gradient along the length of said heat exchanger, said gradient being such that the temperature of said interior wall portion of said heat exchanger is greatest adjacent said melt and decreases as the distance from said melt increases, said heat exchanger having a fluid flow channel located on the side of said inner wall portion opposite said solid material and extending from a point spaced from said melt to a point nearer said melt, and said heat extraction being controlled by causing fluid to flow in said channel from said point spaced from said melt to said point nearer said melt, the temperature of said fluid at said point spaced from said melt being less than the temperature of said fluid at said point nearer said melt.

15. In a crystal growth process wherein a solid material is forming by drawing upwardly from a melt, that improvement comprising the steps of:

providing an elongated heat exchanger above said melt, said heat exchanger having an inside wall portion defining a passage having an axis extending generally upwardly from said melt through which material may be drawn and an outside wall portion;

drawing said solid material upwardly through said passage of said heat exchanger along said axis in close proximity to said inside wall portion of said heat exchanger; and, controlling the extraction of heat from said solid material to said heat exchanger as it is drawn through said heat exchanger by producing in said heat exchanger a temperature gradient along the length of said heat exchanger, said gradient being such that the temperature of said interior wall portion of said heat exchanger is greatest adjacent said melt and decreases as the distance from said melt increases, and the cross-sectional area and outer periphery of said heat exchanger in planes generally perpendicular to said axis being greater in a said plane spaced from said melt than in ones of said planes nearer said melt whereby the cross-section of said heat exchanger for heat conduction and the external surface area of said heat exchanger for radiation increases as the distance from the melt increases.

* * * * *